US011837583B2

(12) United States Patent
Heo et al.

(10) Patent No.: US 11,837,583 B2
(45) Date of Patent: *Dec. 5, 2023

(54) DISPLAY DEVICE AND METHOD FOR MANUFACTURING DISPLAY DEVICE

(71) Applicant: Samsung Display Co., Ltd., Yongin-si (KR)

(72) Inventors: Euikang Heo, Seoul (KR); Cha-Dong Kim, Seoul (KR); Hyunae Kim, Seoul (KR); Chongsup Chang, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/520,153

(22) Filed: Nov. 5, 2021

(65) Prior Publication Data

US 2022/0059513 A1 Feb. 24, 2022

Related U.S. Application Data

(63) Continuation of application No. 16/579,786, filed on Sep. 23, 2019, now Pat. No. 11,171,125.

(30) Foreign Application Priority Data

Nov. 15, 2018 (KR) .................. 10-2018-0140929

(51) Int. Cl.
 *H01L 25/075* (2006.01)
 *H01L 33/62* (2010.01)
 *H01L 27/12* (2006.01)

(52) U.S. Cl.
 CPC ...... *H01L 25/0753* (2013.01); *H01L 27/1214* (2013.01); *H01L 33/62* (2013.01);
 (Continued)

(58) Field of Classification Search
 CPC . H01L 2223/6633; H01L 2224/75355–79355; H01L 25/0753; H01L 27/1214; H01L 33/62; H01L 2933/0066
 (Continued)

(56) References Cited

U.S. PATENT DOCUMENTS 5,956,362 A * 9/1999 Yokogawa ............. B82Y 20/00
 372/96
8,680,562 B2 * 3/2014 Seo ........................ H10K 59/32
 438/22
(Continued)

FOREIGN PATENT DOCUMENTS

JP    2018181460 A  * 11/2018  ......... H01L 27/3258
KR  10-2017-0026959     3/2017
(Continued)

*Primary Examiner* — Matthew E Warren
(74) *Attorney, Agent, or Firm* — KILE PARK REED & HOUTTEMAN PLLC

(57) ABSTRACT

A display device including a pixel circuit, an insulation layer covering the pixel circuit, an etching prevention layer disposed on the insulation layer, a first guide layer, a second guide layer, a first electrode, a second electrode, and a light emitting element. The first guide layer and the second guide layer may be disposed on the etching prevention layer and spaced apart from each other. The first electrode may be disposed on the first guide layer and electrically connected to the pixel circuit. The second electrode may be disposed on the first guide layer and insulated from the first electrode. The light emitting element may be in contact with the top surface of the etching prevention layer, disposed between the first guide layer and the second guide layer on a plane, and electrically connected to the first electrode and the second electrode.

21 Claims, 14 Drawing Sheets

(52) U.S. Cl.
CPC ............... *H01L 2223/6633* (2013.01); *H01L 2933/0066* (2013.01)

(58) Field of Classification Search
USPC .................................. 438/31; 257/116–118
See application file for complete search history.

(56) References Cited

U.S. PATENT DOCUMENTS

| | | | |
|---|---|---|---|
| 9,293,737 B2* | 3/2016 | Baek | .................... H01L 51/5271 |
| 9,705,034 B2* | 7/2017 | Matsumura | ........... H01L 33/145 |
| 9,716,208 B2 | 7/2017 | Dozen et al. | |
| 10,230,020 B2 | 3/2019 | Sasaki et al. | |
| 10,510,801 B2 | 12/2019 | Sato et al. | |
| 10,553,761 B2 | 2/2020 | Tsai et al. | |
| 11,171,125 B2* | 11/2021 | Heo | ...................... H01L 27/124 |
| 2018/0012876 A1 | 1/2018 | Kim et al. | |
| 2018/0175106 A1* | 6/2018 | Kim | ....................... H01L 33/20 |
| 2019/0326348 A1 | 10/2019 | Im et al. | |
| 2021/0202451 A1* | 7/2021 | Kong | ....................... H01L 33/44 |
| 2021/0358393 A1* | 11/2021 | Kang | ....................... G09G 3/32 |

FOREIGN PATENT DOCUMENTS

| | | | |
|---|---|---|---|
| KR | 10-2018-0007025 | 1/2018 | |
| KR | 10-2018-0020239 | 2/2018 | |
| KR | 10-2018-0072909 | 7/2018 | |
| KR | 10-2019-0121894 | 10/2019 | |
| KR | 10-2020-0004936 | 1/2020 | |
| KR | 20200034906 A * | 4/2020 | ........... H01L 27/156 |
| WO | WO-2020075935 A1 * | 4/2020 | ........... H01L 27/156 |

* cited by examiner

DISPLAY DEVICE AND METHOD FOR MANUFACTURING DISPLAY DEVICE

CROSS-REFERENCE TO RELATED APPLICATIONS

This is a continuation application of U.S. patent application Ser. No. 16/579,786, filed Sep. 23, 2019, now U.S. Pat. No. 11,171,125 issued Nov. 9, 2021, the disclosure of which is incorporated herein by reference in its entirety. U.S. patent application Ser. No. 16/579,786 claims priority to and benefit of Korean Patent Application No. 10-2018-0140929 under 35 U.S.C. § 119, filed on Nov. 15, 2018, in the Korean Intellectual Property Office, the entire contents of which are incorporated herein by reference.

BACKGROUND

Field

Exemplary embodiments of the present invention relate to a display device having improved reliability and manufacturing yield, and a method for manufacturing the display device.

Discussion of the Background

A display device may include a light emitting element electrically connected to an electrode, and may emit light according to a voltage applied to the electrode. A light emitting element may be directly formed on an electrode, or a light emitting element formed separately from the electrode may be connected to the electrode. When a light emitting element is separately formed and then connected to an electrode, a process for aligning the light emitting element on the electrode is required. When the light emitting element is not properly aligned on the electrode, the light emitting element may not emit light.

The above information disclosed in this Background section is only for understanding of the background of the inventive concepts, and, therefore, it may contain information that does not constitute prior art.

SUMMARY

Exemplary embodiments of the present invention provide a display device having improved reliability and manufacturing yield, and a method for manufacturing the display device.

Additional features of the inventive concepts will be set forth in the description which follows, and in part will be apparent from the description, or may be learned by practice of the inventive concepts.

An exemplary embodiment of the inventive concept provides a display device including a pixel circuit, an insulation layer, an etching prevention layer, a first guide layer, a second guide layer, a first electrode, a second electrode, and a light emitting element.

The insulation layer may cover the pixel circuit, and the etching prevention layer may be disposed on the insulation layer.

The first guide layer may be disposed on the etching prevention layer. The second guide layer may be disposed on the etching prevention layer and spaced apart from the first guide layer.

The first electrode may be disposed on the first guide layer and electrically connected to the pixel circuit. The second electrode may be disposed on the first guide layer and insulated from the first electrode.

The light emitting element may be in contact with the top surface of the etching prevention layer, disposed between the first guide layer and the second guide layer on a plane, and electrically connected to the first electrode and the second electrode.

A material constituting the etching prevention layer and a material forming each of the first guide layer and the second guide layer may have an etching selectivity of 1:N, and N may be 2 or more.

The etching prevention layer may include silicon oxide, and the first guide layer and the second guide layer may include silicon nitride.

On a plane, the first guide layer may be covered by the first electrode, and the second guide layer may be covered by the second electrode.

On a plane, the outer edge of the first electrode may have a shape substantially the same as or similar to the outer edge of the first guide layer. On a plane, the outer edge of the second electrode may have a shape substantially the same as or similar to the outer edge of the second guide layer.

The display device may further include a first wall and a second wall. In an embodiment, the first wall may be disposed between the first guide layer and the first electrode. The second wall may be disposed between the second guide layer and the second electrode.

The first electrode and the second electrode may be respectively extended in a first direction and spaced apart from each other in a second direction crossing the first direction. The first wall may have a smaller width than the first guide layer in the second direction. The second wall may have a smaller width than the second guide layer in the second direction.

The first electrode and the second electrode may be respectively extended in the first direction and spaced apart from each other in the second direction crossing the first direction. The length of the light emitting element may be less than the distance between the first electrode and the second electrode in the second direction.

The thickness of each of the first guide layer and the second guide layer may be equal to or less than the thickness of the light emitting element.

Another exemplary embodiment of the inventive concept provides a method for manufacturing a display device including forming a pixel circuit on a base layer, forming an insulation layer covering the pixel circuit, forming an etching prevention layer on the insulation layer, forming a guide insulation layer on the etching prevention layer, forming, on the guide insulation layer, a first electrode and a second electrode which are spaced apart from each other through an etching process using a photoresist pattern as a mask, forming a first guide layer and a second guide layer by etching the guide insulation layer using the photoresist pattern as a mask, providing a light emitting element between the first guide layer and the second guide layer, and aligning the light emitting element.

Forming the first electrode and the second electrode may include forming a first reflective electrode and a second reflective electrode on the guide insulation layer which are spaced apart from each other, forming a capping layer on the first reflective electrode and the second reflective electrode, forming the photoresist pattern on the capping layer, and forming a first capping layer covering the first reflective layer and a second capping layer covering the second reflective electrode by patterning the capping layer using the photoresist pattern as a mask.

A material constituting the etching prevention layer and a material constituting the guide insulation layer may have an etching selectivity of 1:N, where N may be 2 or more.

The etching prevention layer may include silicon oxide, and the guide insulation layer may include silicon nitride.

The first electrode and the second electrode may be formed through a wet etching process, and the first guide layer and the second guide layer may be formed through a dry etching process.

In the step of forming of the first guide layer and the second guide layer, the etching prevention layer may not be etched.

The method may further include forming, on the guide insulation layer, a first wall and a second wall which are spaced apart from each other after forming the guide insulation layer.

The first electrode and the second electrode may be respectively extended in a first direction and spaced apart from each other in a second direction crossing the first direction. The first wall may have a smaller width than the first guide layer in the second direction. The second wall may have a smaller width than the second guide layer in the second direction.

Another exemplary embodiment of the inventive concept provides a display device including a pixel circuit, an insulation layer covering the pixel circuit, a first guide layer disposed on the insulation layer, a second guide layer disposed on the insulation layer and spaced apart from the first guide layer, a first electrode disposed on the first guide layer and electrically connected to the pixel circuit, a second electrode disposed on the second guide layer and insulated from the first electrode, and a light emitting element electrically connected to the first electrode and the second electrode.

The first electrode and the second electrode may be respectively extended in a first direction and spaced apart from each other in a second direction crossing the first direction. The light emitting element may be disposed between an end of the first electrode and an end of the second electrode facing each other in the second direction.

On a plane, the light emitting element may not overlap the end of the first electrode and the end of the second electrode.

The display device may further include an etching prevention layer disposed between the insulation layer and the first guide layer and between the insulation layer and the second guide layer. The light emitting layer may be in contact with the top surface of the etching prevention layer.

On a plane, the outer edge of the first electrode may have a shape substantially the same as or similar to the outer edge of the first guide layer.

On a plane, the outer edge of the second electrode may have a shape substantially the same as or similar to the outer edge of the second guide layer.

The thickness of each of the first guide layer and the second guide layer may be equal to or less than the thickness of the light emitting element.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept.

DETAILED DESCRIPTION

Figure 1:
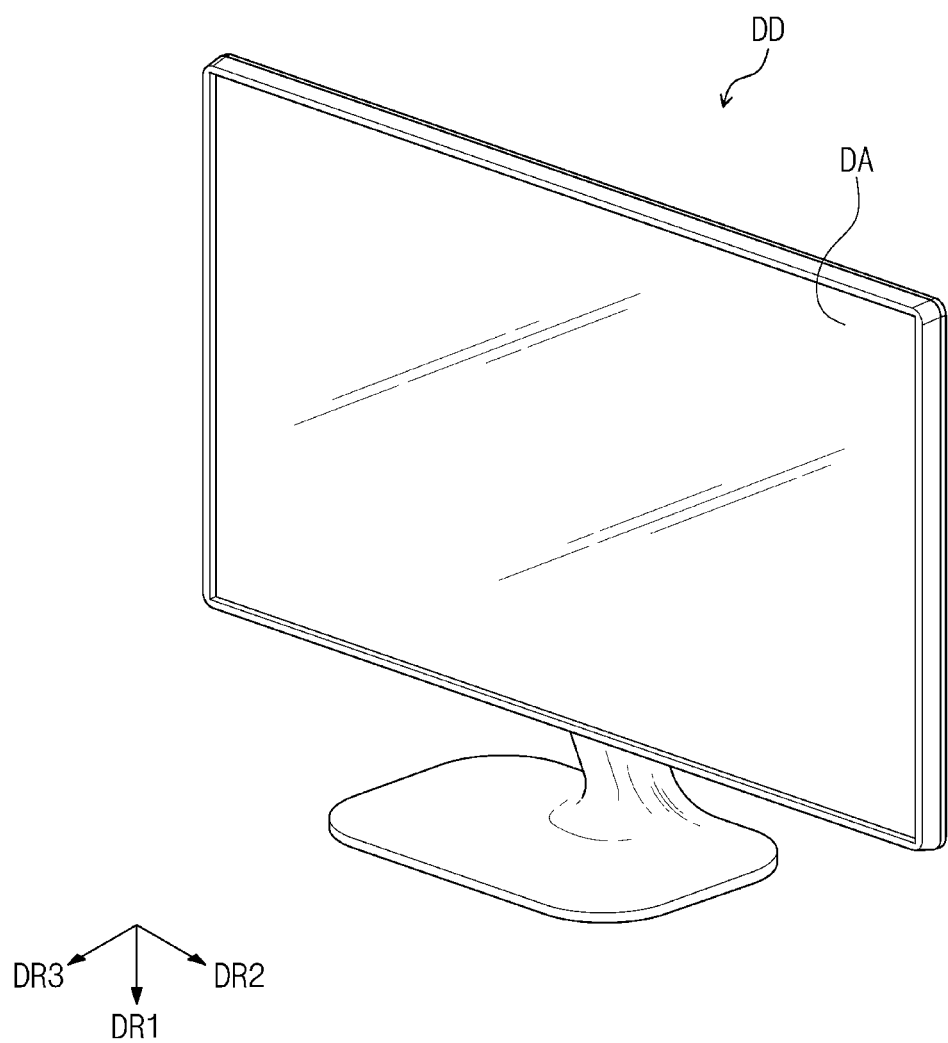
FIG. 1 is a perspective view of a display device according to an exemplary embodiment of the inventive concept.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concept will be described with reference to the accompanying drawings.

FIG. 1 is a perspective view of a display device according to an exemplary embodiment of the inventive concept.

Referring to FIG. 1, a display device DD may display an image through a display area DA. In FIG. 1, the display area DA is exemplarily illustrated as being provided on a surface defined by a first direction DR1 and a second direction DR2 crossing the first direction DR1. However, a display area of a display device may be provided on a bent surface in another exemplary embodiment.

The thickness direction of the display device DD is indicated by a third direction DR3. Directions indicated by the first to third directions DR1, DR2, and DR3 are a relative concept, and may be converted to different directions. In the present disclosure, "when viewed on a plane" may mean when viewed from the direction DR3. Also, the "thickness direction" may mean the third direction DR3.

In FIG. 1, the display device DD is exemplarily illustrated as being a television. However, the display device DD may be used for large electronic devices, such as a monitor, or an external advertisement board, and also for small and medium-sized electronic devices such as a personal computer, a notebook computer, a personal digital terminal, a car navigation system unit, a game machine, a smart phone, a tablet, and a camera. It should be understood that these are merely examples, and the display device DD may be employed in other electronic devices without departing from the inventive concept.

Figure 2:
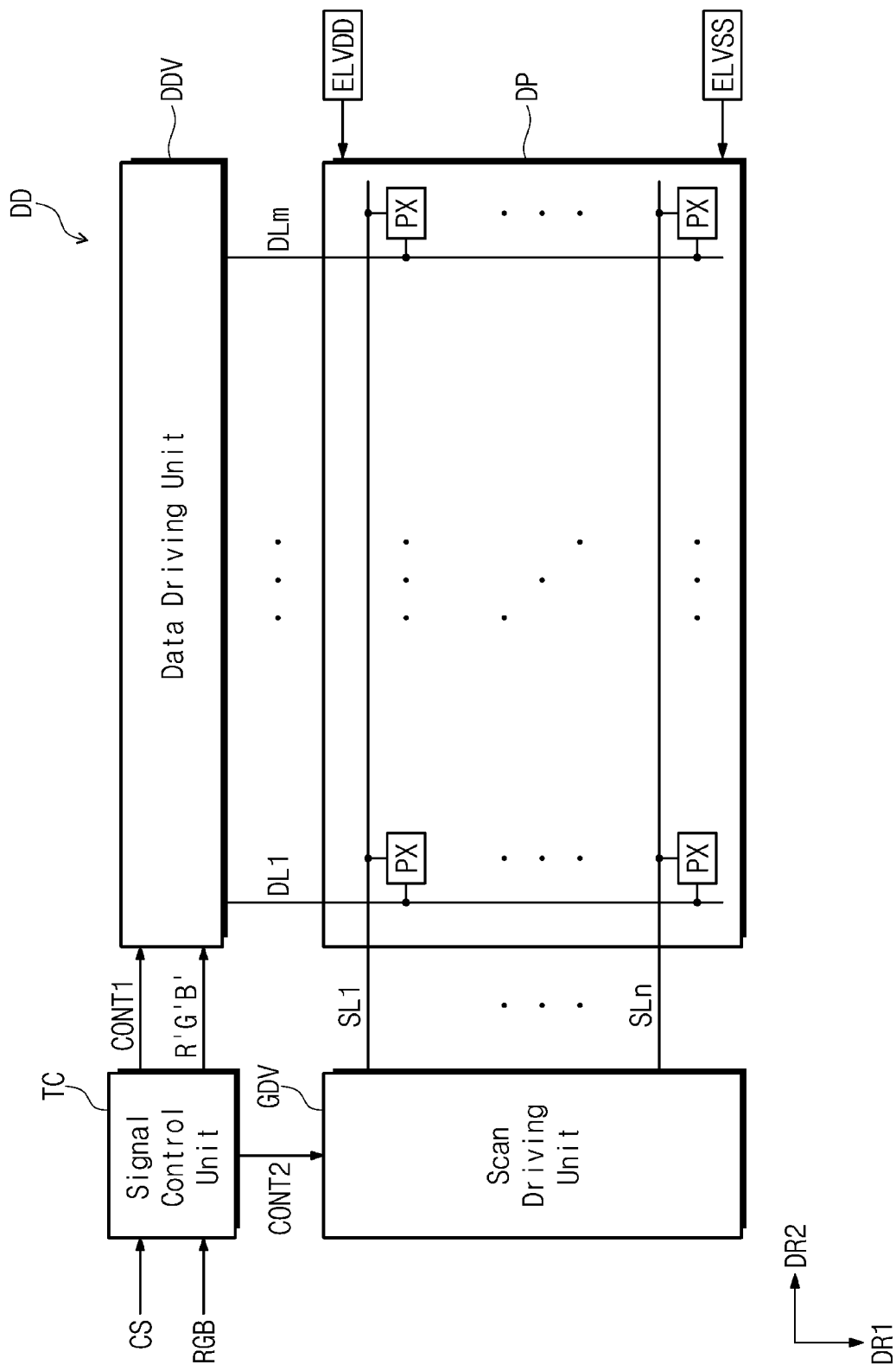
FIG. 2 is a block diagram of a display device according to an exemplary embodiment of the inventive concept.

FIG. 2 is a block diagram of a display device according to an exemplary embodiment of the inventive concept.

Referring to FIG. 2, the display device DD may include a display panel DP, a signal control unit TC (or a timing controller), a data driving unit DDV, and a scan driving unit GDV. Each of the signal control unit TC, the data driving unit DDV, and the scan driving unit GDV may include an electronic circuit.

The display panel DP may be a micro-light emitting element display panel DP including a micro-light emitting element. For example, the display panel DP may be a micro-LED display panel DP.

The display panel DP may include a plurality of data lines DL1-DLm, a plurality of scan lines SL1-SLn, and a plurality of pixels PX.

The plurality of data lines DL1-DLm are extended in the first direction DR1, and may be arranged along the second direction DR2 crossing the first direction DR1. The plurality of scan lines SL1-SLn are extended in the second direction DR2, and may be arranged along the first direction DR1.

Each of the pixels PX may include a light emitting element and a pixel circuit electrically connected to the light emitting element. The pixel circuit may include a plurality of transistors. A first power supply voltage ELVDD and a second power supply voltage ELVSS may be provided to each of the pixels PX.

The pixels may be disposed according to a predetermined rule on a plane of the display panel DP. Each of the pixels PX may display one of primary colors or one of a mixed color thereof. The primary colors may include red, green, and blue, and the mixed color may include various colors such as yellow, cyan, magenta, and white. However, colors displayed by the pixels PX are not limited thereto.

The signal control unit TC receives an image data RGB provided from the outside. The signal control unit TC converts the image data RGB so as to conform to an operation of the display panel DP and generates converted image data R'G'B', and then outputs the converted image data R'G'B' to the data driving unit DDV.

In addition, the signal control unit TC may receive a control signal CS provided from the outside. Examples of the control signal CS may include a vertical synchronization signal, a horizontal synchronization signal, a main clock signal, a data enable signal, and the like. The signal control unit TC provides a first control signal CONT1 to the data driving unit DDV, and provides a second control signal CONT2 to the scan driving unit GDV. The first control signal CONT1 is a signal for controlling the data driving unit DDV, and the second control signal CONT2 is a signal for controlling the scan driving unit GDV.

The data driving unit DDV may provide an electrical signal to the plurality of data lines DL1-DLm in response to the first control signal CONT1 received from the signal control unit TC. The data driving unit DDV may be implemented as an independent integrated circuit and electrically connected to one side of the display panel DP, or may be directly mounted on the display panel DP. Also, the data driving unit DDV may be implemented as a single chip, or may include a plurality of chips.

The scan driving unit GDV may provide an electrical signal to the plurality of scan lines SL1-SLn in response to the second control signal CONT2 received from the signal control unit TC. The scan driving unit GDV may be integrated in a predetermined region of the display panel DP. For example, the scan driving unit GDV may include a plurality of thin film transistors formed through the same process of a driving circuit of the pixels PX, for example, a Low Temperature Polycrystalline Silicon ("LTPS") process or a Low Temperature Polycrystalline Oxide ("LTPO") process. In another exemplary embodiment of the inventive concept, the scan driving unit GDV may be implemented as an independent integrated circuit and electrically connected to one side of the display panel DP.

While a gate-on voltage is being applied to one of the plurality of scan lines SL1-SLn, a switching transistor of each of pixels in one row connected thereto is turned on. At this time, the data driving unit DDV provides data driving signals to the data lines DL1-DLm. The data driving signals provided to the data lines DL1-DLm are applied to a corresponding pixel through a turned-on switching transistor. The data driving signals may be analog voltages corresponding to gray scale values of the image data RGB.

Figure 3:
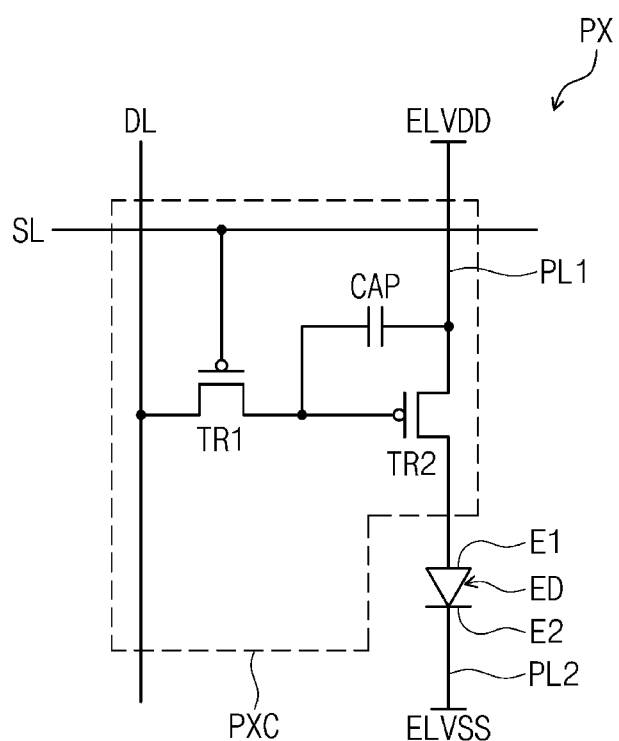
FIG. 3 is an equivalent circuit diagram of a pixel according to an exemplary embodiment of the inventive concept.

FIG. 3 is an equivalent circuit diagram of a pixel according to an exemplary embodiment of the inventive concept. FIG. 3 shows an equivalent circuit diagram of one pixel PX (hereinafter referred to as a pixel) among the plurality of pixels PX shown in FIG. 2.

Referring to FIG. 3, the pixel PX may be electrically connected to a plurality of signal lines. In the present exemplary embodiment, among the signal lines, a scan line SL, a data line DL, a first power line PL1, and a second power line PL2 are exemplarily illustrated. However, this is only exemplary, and the pixel PC according to the inventive concept may be additionally connected to various signal lines, and is not limited to any specific exemplary embodiment.

The pixel PX may include a light emitting element ED, a first electrode E1, a second electrode E2, and a pixel circuit PXC. The pixel circuit PXC may include a first thin film transistor TR1, a capacitor CAP, and a second thin film transistor TR2. However, this is only an example, and the number of thin film transistors and capacitors included in the pixel circuit PXC is not limited to that shown in FIG. 3. For example, in another exemplary embodiment of the inventive concept, the pixel circuit PXC may include 7 thin film transistors and one capacitor.

The first thin film transistor TR1 may be a switching transistor for controlling on/off of the pixel PX. The first thin film transistor TR1 may transmit or block a data signal transmitted through the data line DL in response to a scan signal transmitted through the scan line SL.

The capacitor CAP is connected to the first thin film transistor TR1 and the first power line PL1. The capacitor CAP charges the amount of charge corresponding to the difference between the data signal transmitted from the first thin film transistor TR1 and the first power supply voltage ELVDD applied to the first power line PL1.

The second thin film transistor TR2 is connected to the first thin film transistor TR1, the capacitor CAP, and the light emitting element ED. The second thin film transistor TR2 controls a driving current flowing in the light emitting element ED in accordance with the amount of charge stored in the capacitor CAP. The turn-on time of the second thin film transistor TR2 may be determined according to the amount of charge charged in the capacitor CAP.

The first thin film transistor TR1 and the second thin film transistor TR2 may be an N-type thin film transistor or a P-type thin film transistor. Also, in another exemplary embodiment of the inventive concept, at least one of the first thin film transistor TR1 and the second thin film transistor TR2 may be an N-type thin film transistor, and the other thereof may be a P-type thin film transistor.

The light emitting element ED is connected to the second thin film transistor TR2 and the second power line PL2. For example, the light emitting element ED may be connected to the first electrode E1 electrically connected to the second thin film transistor TR2 and the second electrode E2 connected to the second power line PL2. The first electrode E1 is electrically connected to the pixel circuit PXC, and the second electrode E2 may receive a power supply voltage, for example, the second power supply voltage ELVSS through the second power line PL2.

The light emitting element ED emits light to a voltage corresponding to the difference between a signal transmitted through the second thin film transistor TR2 and the second power supply voltage ELVSS received through the second power line PL2.

The light emitting element ED may be a micro-LED element. The micro-LED element may be an LED element having a length of several nanometers to several hundreds of micrometers. However, the length of the micro-LED element is only exemplary, and the length of the micro-LED element is not limited to the above numerical range.

In FIG. 3, one light emitting element ED is exemplarily shown to be connected between the second thin film transistor TR2 and the second power line PL2. However, the light emitting element ED may be provided in plurality. The plurality of light emitting devices ED may be connected in parallel with each other.

Figure 4A:
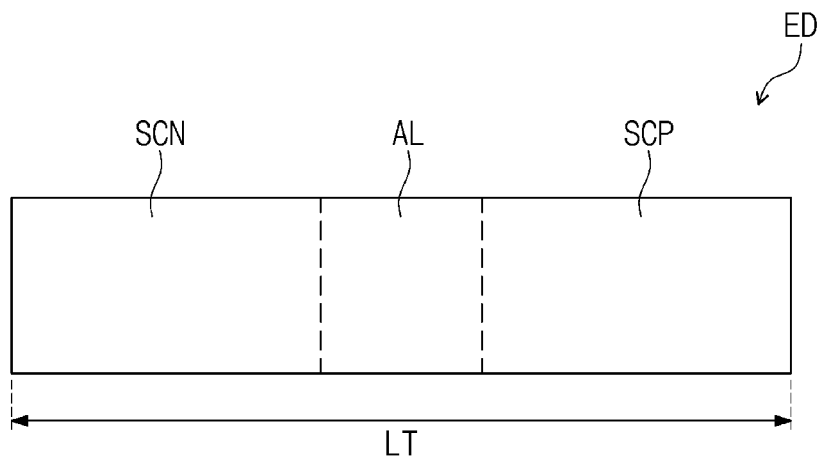
FIG. 4A is a cross-sectional view of a light emitting element according to an exemplary embodiment of the inventive concept.

FIG. 4A is a cross-sectional view of a light emitting element according to an exemplary embodiment of the inventive concept.

The light emitting element ED may have various shapes, such as a cylindrical shape or a polygonal column shape. FIG. 4A shows a cross-section of the light emitting element ED.

Referring to FIG. 4A, the light emitting element ED may include an n-type semiconductor layer SCN, a p-type semiconductor layer SCP, and an active layer AL. The active layer AL may be disposed between the n-type semiconductor layer SCN and the p-type semiconductor layer SCP.

The n-type semiconductor layer SCN may be provided by doping a semiconductor layer with an n-type dopant, and the p-type semiconductor layer SCP may be provide by doping a semiconductor layer with a p-type dopant. The semiconductor layer may contain a semiconductor material, and the semiconductor material may be any one of GaN, AlN, AlGaN, InGaN, InN, InAlGaN, or AlInN, but is not limited thereto. The n-type dopant may be any one of silicon (Si), germanium (Ge), tin (Sn), selenium (Se), tellurium (Te), or a combination thereof, but is not limited thereto. The p-type dopant may be any one of magnesium (Mg), zinc (Zn), calcium (Ca), strontium (Sr), barium (Ba), or a combination thereof, but is not limited thereto.

The active layer AL may be formed in at least one of a single quantum well structure, a multiple quantum well structure, a quantum wire structure, or a quantum dot structure. The active layer AL may be a region in which electrons injected through the n-type semiconductor layer SCN and holes injected through the p-type semiconductor layer SCP are recombined. The active layer AL is a layer that emits light having energy determined by a material-specific energy band. The position of the active layer AL may vary according to the type of a diode.

The n-type semiconductor SCN is connected to any one of the first electrode E1 (see FIG. 5) and the second electrode E2 (see FIG. 5), and the p-type semiconductor layer SCP is connected to the other of the first electrode E1 and the second electrode E2.

The length LT of the light emitting element ED may be several nanometers to several hundreds of micrometers and, for example, may be 1 micrometer to 100 micrometers.

Figure 4B:
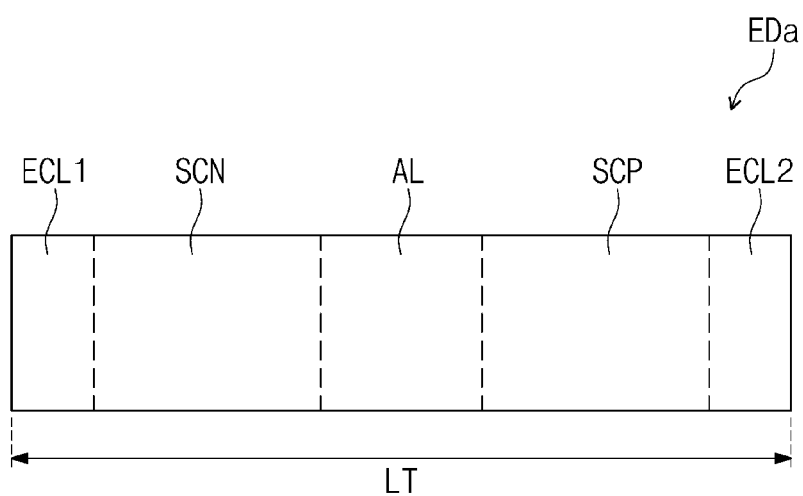
FIG. 4B is a cross-sectional view of a light emitting element according to an exemplary embodiment of the inventive concept.

FIG. 4B is a cross-sectional view of a light emitting element according to an exemplary embodiment of the inventive concept.

Referring to FIG. 4B, a light emitting element EDa may further include a first electrode layer ECL1 and a second electrode layer ECL2 when compared with the light emitting element ED of the FIG. 4A.

The first electrode layer ECL1 may be adjacent to the n-type semiconductor layer SCN, and the second electrode layer ECL2 may be adjacent to the p-type semiconductor layer SCP. For example, the first electrode layer ECL1, the n-type semiconductor layer SCN, the active layer AL, the p-type semiconductor layer SCP, and the second electrode layer ECL2 may be sequentially laminated.

Each of the first electrode layer ECL1 and the second electrode layer ECL2 may be formed of a metal or an alloy of metals. For example, each of the first electrode layer ECL1 and the second electrode layer ECL2 may be formed of any one metal selected from among molybdenum (Mo), chromium (Cr), nickel (Ni), gold (Au), aluminum (Al), titanium (Ti), platinum (Pt), vanadium (V), tungsten (W), lead (Pd), copper (Cu), rhodium (Rh) and iridium (Ir), or an alloy thereof. The first electrode layer ECL1 and the second electrode layer ECL2 may include the same material, or may include materials different from each other.

Figure 4C:
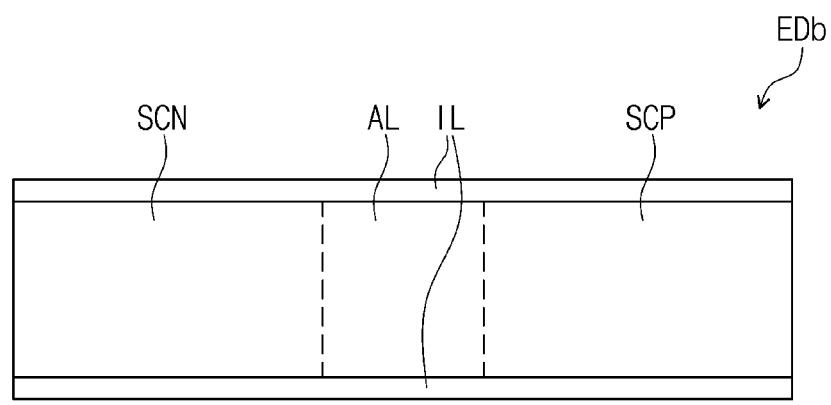
FIG. 4C is a cross-sectional view of a light emitting element according to an exemplary embodiment of the inventive concept.

FIG. 4C is a cross-sectional view of a light emitting element according to an exemplary embodiment of the inventive concept.

Referring to FIG. 4C, a light emitting element EDb may further include an insulation film IL when compared with the light emitting element ED of FIG. 4A. For example, the light emitting element EDb may have a core-shell structure.

The insulation film IL covers the n-type semiconductor layer SCN, the p-type semiconductor layer SCP, and the active layer AL, and may protect an outer surface of the n-type semiconductor layer SCN, the p-type semiconductor layer SCP, the active layer AL. In another exemplary embodiment of the inventive concept, the insulation film IL may cover only the active layer AL.

Figure 4D:
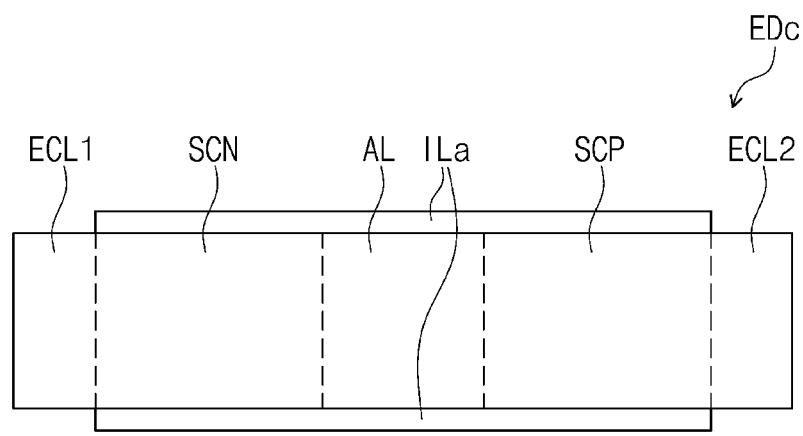
FIG. 4D is a cross-sectional view of a light emitting element according to an exemplary embodiment of the inventive concept.

FIG. 4D is a cross-sectional view of a light emitting element according to an exemplary embodiment of the inventive concept.

Referring to FIG. 4D, a light emitting element EDc may further include an insulation film ILa when compared with the light emitting element ED of FIG. 4B.

The insulation film ILa covers the n-type semiconductor layer SCN, the p-type semiconductor layer SCP, and the active layer AL, and may not cover the first electrode layer ECL1 and the second electrode layer ECL2. However, in another exemplary embodiment of the inventive concept, the insulation film ILa may cover at least a portion of the first electrode layer ECL1 and the second electrode layer ECL2, and may cover the first electrode layer ECL1 and the second electrode layer ECL2, entirely.

Figure 5:
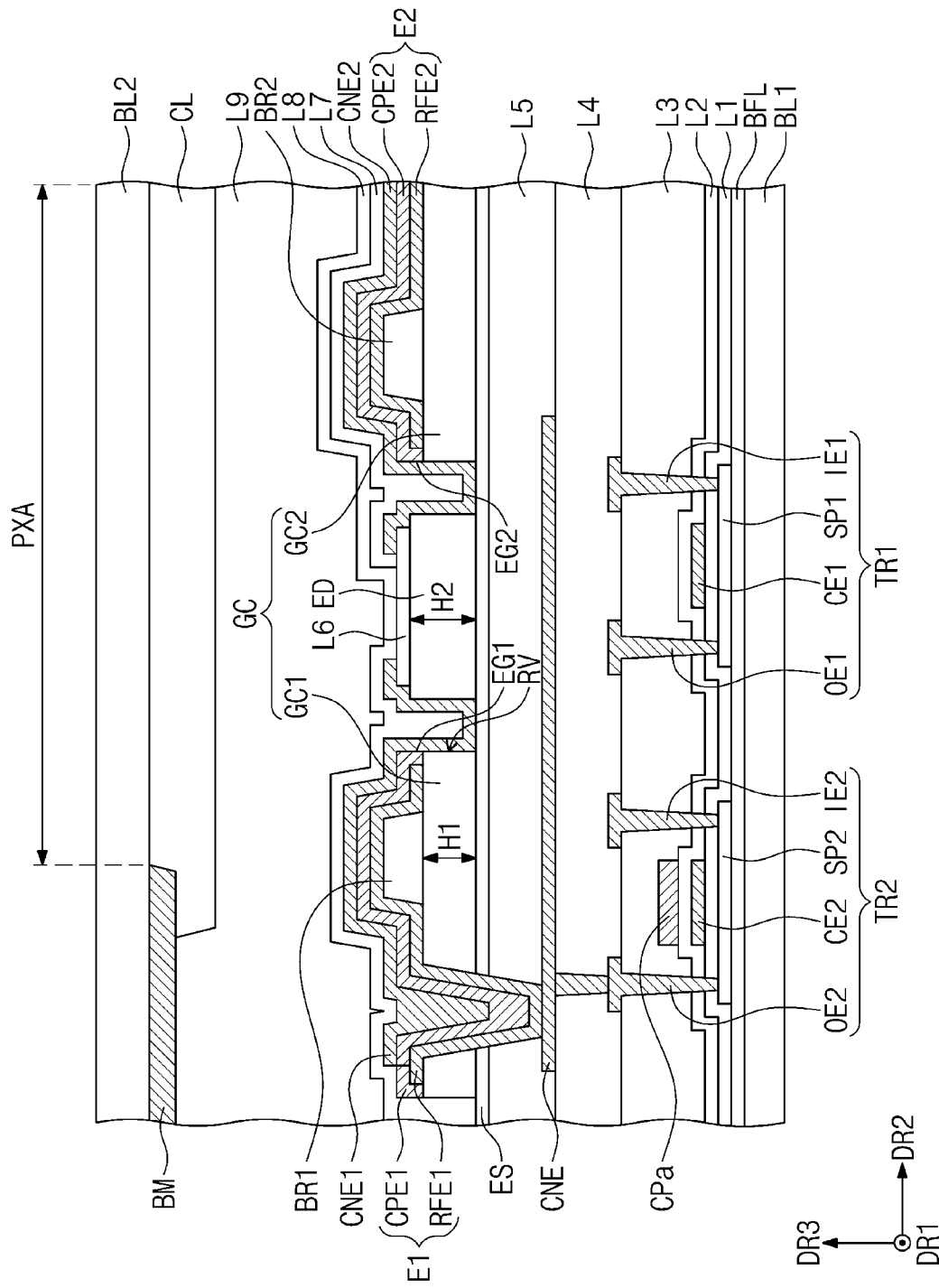
FIG. 5 is a cross-sectional view of a display panel according to an exemplary embodiment of the inventive concept.
Figure 6:
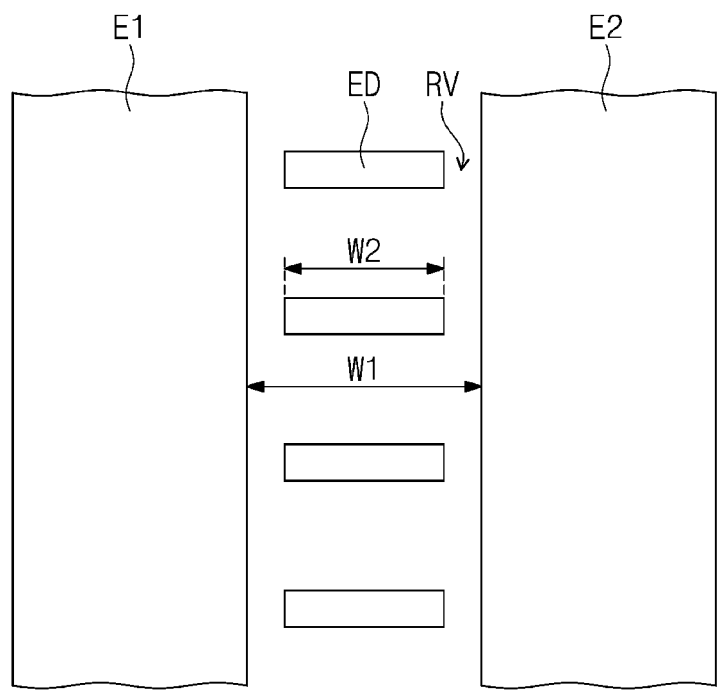
FIG. 6 is a plan view showing a partial configuration of a display panel according to an exemplary embodiment of the inventive concept.
Figure 6:
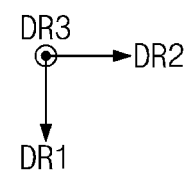

FIG. 5 is a cross-sectional view of a display panel according to an exemplary embodiment of the inventive concept, and FIG. 6 is a plan view showing a partial configuration of a display panel according to an exemplary embodiment of the inventive concept. To facilitate the description, FIG. 5 and FIG. 6 show regions corresponding to one pixel, and some configurations are not shown.

Referring to FIGS. 5 and 6, a first base layer BL1 and a second base layer BL2 may face each other. Each of the first base layer BL1 and the second base layer BL2 may be a silicon substrate, a plastic substrate, a glass substrate, an insulation film, or a laminated structure including a plurality of insulation layers.

On the first base layer BL1, a buffer layer BFL may be disposed. On the buffer layer BFL, the first thin film transistor TR1, and the second thin film transistor TR2 may be disposed.

The first thin film transistor TR1 may include a first control electrode CE1, a first input electrode IE1, a first output electrode OE1, and a first semiconductor pattern SP1. The second thin film transistor TR2 may include a second control electrode CE2, a second input electrode IE2, a second output electrode OE2, and a second semiconductor pattern SP2.

The first semiconductor pattern SP1 and the second semiconductor pattern SP2 may be disposed on the buffer layer BFL. The buffer layer BFL may provide a modified surface to the first semiconductor pattern SP1 and the second semiconductor pattern SP2. In this case, the first semiconductor pattern SP1 and the second semiconductor pattern SP2 may have greater adhesion force to the buffer layer BFL than when being directly formed on the first base layer BL1. Alternatively, the buffer layer BFL may be a barrier layer for protecting the bottom surface of each of the first semiconductor pattern SP1 and the second semiconductor pattern SP2. In this case, the buffer layer BFL may block contaminants or moisture introduced through the first base layer BL1 from permeating into the first semiconductor pattern SP1 and the second semiconductor pattern SP2.

A first insulation layer L1 is disposed on the buffer layer BFL, and may cover the first semiconductor pattern SP1 and the second semiconductor pattern SP2. The first insulation layer L1 may include an inorganic material. The inorganic material may be, for example, any one of silicon nitride, silicon oxynitride, silicon oxide, titanium oxide, or aluminum oxide, but is not limited thereto.

On the first insulation layer L1, the first control electrode CE1 and the second control electrode CE2 may be disposed. A second insulation layer L2 is disposed on the first insulation layer L1, and may cover the first control electrode CE1 and the second control electrode CE2. The second insulation layer L2 may include an inorganic material.

The capacitor CAP (see FIG. 3) may include a first cap electrode (not shown) and a second cap electrode CPa. For example, the first cap electrode may be branched from the second control electrode CE2, and the second cap electrode CPa may be disposed on the second insulation layer L2.

A third insulation layer L3 is disposed on the second insulation layer L2, and covers the second cap electrode CPa. The first input electrode IE1, the first output electrode OE1, the second input electrode IE2, and the second output electrode OE2 may be disposed on the third insulation layer L3. The first input electrode IE1 and the first output electrode OE1 may be connected to the first semiconductor pattern SP1 through through-holes passing through the first to third insulation layers L1, L2, and L3. The second input electrode IE2 and the second output electrode OE2 may be connected to the second semiconductor pattern SP2 through through-holes passing through the first to third insulation layers L1, L2, and L3. On the third insulation layer L3, not only the first input electrode IE1, the first output electrode OE1, the second input electrode IE2, and the second output electrode OE2, but also signal lines, for example, at least a portion of each of scan lines or data lines may be disposed.

A fourth insulation layer L4 is disposed on the third insulation layer L3, and may cover the first input electrode IE1, the first output electrode OE1, the second input electrode IE2, and the second output electrode OE2. The fourth insulation layer L4 may be composed of a single layer, or of multiple layers, and the fourth insulation layer L4 may include an organic material and/or an inorganic material.

On the fourth insulation layer L4, a connection electrode CNE may be disposed. On the fourth insulation layer L4, not only the connection electrode CNE, but also signal lines, for example, at least the other portion of each of the scan lines or the data lines may be disposed. The connection electrode CNE may be connected to the second output electrode OE2.

A fifth insulation layer L5 is disposed on the fourth insulation layer L4, and may cover the connection electrode CNE. The fifth insulation layer L5 may include an inorganic material. The fifth insulation layer L5 covers the pixel circuit PXC (see FIG. 3) disposed therebelow, and may provide a flat surface.

On the fifth insulation layer L5, an etching prevention layer ES is disposed. Except for a region in which a contact hole is formed, the etching prevention layer ES may be disposed on the entire first base layer BL1 on which the fifth insulation layer L5 is formed.

The etching prevention layer ES may provide a flat surface to the light emitting element ED disposed thereabove. The etching prevention layer ES may include various insulation materials, and in an exemplary embodiment of the inventive concept, may include silicon oxide.

On the etching prevention layer ES, a guide layer GC may be disposed. The guide layer GC may include a first guide layer GC1 and a second guide layer GC2. Each of the first guide layer GC1 and the second guide layer GC2 may be extended in the first direction DR1. The first guide layer GC1 and the second guide layer GC2 may be spaced apart from each other in the second direction DR2.

Between the first guide layer GC1 and the second guide layer GC2, a seating groove RV may be defined.

The first guide layer GC1 and the second guide layer GC2 may include the same material. The first guide layer GC1 and the second guide layer GC2 may include various insulation materials, and in an exemplary embodiment of the inventive concept, may include silicon nitride.

In an exemplary embodiment of the inventive concept, the etching rate of a material forming each of the first guide layer GC1 and the second guide layer GC2 is faster than the etching rate of a material constituting the etching prevention layer ES. The material constituting the etching prevention layer ES and the material forming each of the first guide layer GC1 and the second guide layer GC2 may have an etching selectivity of 1:N. At this time, N may be 2 or more.

On the guide layer GC, a first wall BR1 and a second wall BR2 are disposed. Each of the first wall BR1 and the second wall BR2 may be extended in the first direction DR1. The second wall BR2 may be spaced apart from the first wall BR1 in the second direction DR2. The first wall BR1 and the second wall BR2 may include the same material. For example, that the first wall BR1 and the second wall BR2 may include an organic material.

The first wall BR1 may have a smaller width than the first guide layer GC1 in the second direction DR2. Also, the second wall BR2 may have a smaller width than the second guide layer GC2 in the second direction DR2.

The first electrode E1 may be disposed on the first guide layer GC1 and the first wall BR1, and the second electrode E2 may be disposed on the second guide layer GC2 and the second wall BR2. The first electrode E1 is extended in the first direction DR1 and may cover the first guide layer GC1 and the first wall BR1, and the second electrode E2 is extended in the first direction DR1 and may cover the second guide layer GC2 and the second wall BR2. Between the first electrode E1 and the fifth insulation layer L5, the etching prevention layer ES, the first guide layer GC1, and the first wall BR1 may be disposed, and between the second electrode E2 and the fifth insulation layer L5, the etching prevention layer ES, the second guide layer GC2, and the second wall BR2 may be disposed.

The etching prevention layer ES, the first guide layer GC1, and the fifth insulation layer L5 are provided with a through-hole, and by the through-hole, the connection electrode CNE may be exposed. The first electrode E1 may be electrically connected to the exposed connection electrode CNE. Although not shown, the second electrode E2 may be electrically connected to the second power line PL2 (see FIG. 3). That is, the second electrode E2 may be provided with the second power supply voltage ELVSS (see FIG. 3).

The first electrode E1 may include a first reflective electrode RFE1 and a first capping electrode CPE1, and the second electrode E2 may include a second reflective electrode RFE2 and a second capping electrode CPE2.

Each of the first reflective electrode RFE1 and the second reflective electrode RFE2 may include a reflective material. Each of the first reflective electrode RFE1 and the second reflective electrode RFE2 may have a single-layered structure or a multi-layered laminate structure. For example, each of the first reflective electrode RFE1 and the second reflective electrode RFE2 may have a structure in which indium tin oxide (ITO), silver (Ag), and indium tin oxide (ITO) are sequentially laminated.

The first capping electrode CPE1 may cap the first reflective electrode RFE1, and the second capping electrode CPE2 may cap the second reflective electrode RFE2. For example, each of the first capping electrode CPE1 and the second capping electrode CPE2 may include at least any one of indium zinc oxide (IZO), indium tin oxide (ITO), indium gallium oxide (IGO), indium zinc gallium oxide (IGZO), or a mixture/compound thereof.

On a plane, the first capping electrode CPE1 may cover the first guide layer GC1, and the second capping electrode CPE2 may cover the second guide layer GC2. The first capping electrode CPE1 and the first guide layer GC1 may be formed using the same photosensitive pattern, and the second capping electrode CPE2 and the second guide layer GC2 may be formed using the same photosensitive pattern. On a plane, an outer edge of the first capping electrode CPE1 and an outer edge of the first guide layer GC1 may be substantially the same. At this time, "substantially the same" means that the shapes of the outer edges are approximately the same and includes a case in which boundaries of the outer edges are partially changed due to process errors in an etching process.

However, the inventive concept is not limited thereto. When the material constituting the first capping electrode CPE1 and the material constituting the first guide layer GC1 are different from each other, degrees of etching thereof may be different, and on a plane, the outer edges of the first capping electrode CPE1 and the first guide layer GC1 may have geometrically similar shapes having a predetermined margin. In the same manner, outer edges of the second capping electrode CPE2 and the second guide layer GC2 may be substantially the same or have geometrically similar shapes having a predetermined margin.

On the etching prevention layer ES, the light emitting element ED may be disposed. The light emitting element ED may be in contact with the top surface of the etching prevention layer ES. A plurality of light emitting elements ED may be provided, and the plurality of light emitting devices ED may be connected in parallel with each other.

The light emitting element ED may be disposed in the seating groove RV defined between the first guide layer GC1 and the second guide layer GC2. Accordingly, the light emitting element ED may be stably disposed in a region between the first electrode E1 and the second electrode E2. Accordingly, the probability that the light emitting device ED is effectively aligned may be increased, and thus, product yield and product reliability may be improved.

Also, since the light emitting element ED is aligned by an electric field applied in the seating groove RV, the light emitting element ED may not be disposed outside the seating groove RV. Accordingly, the problem that wires are short-circuited by the light emitting element ED in an unintended region other than the region between the first electrode E1 and the second electrode E2 may be prevented in advance.

The light emitting element ED may be disposed between the first electrode E1 and the second electrode E2 in the second direction DR2. That is, when viewed from the third direction DR3, the light emitting element ED may not overlap the first electrode E1 and the second electrode E2. In other words, a length W2 of the light emitting element ED may be less than a distance W1 between the first electrode E1 and the second electrode E2 in the second direction DR2.

A thickness H1 of each of the first guide layer GC1 and the second guide layer GC2 may be equal to or less than a thickness H2 of the light emitting element ED. The thickness of each of the first guide layer GC1 and the second guide layer GC2 may be 1.5 μm or less.

Accordingly, the light emitting element ED may be disposed between an end EG1 of the first electrode E1 and an end EG2 of the second electrode E2 facing each other in the second direction DR2. In addition, the light emitting element ED may overlap the end EG1 of the first electrode E1 and the end EG2 of the second electrode E2 in the second direction DR2. In addition, when viewed from the third direction DR3, the light emitting element ED may not overlap the end EG1 of the first electrode E1 and the end EG2 of the second electrode E2.

On the light emitting element ED, a sixth insulation layer L6 (or an insulation pattern) may be disposed. The sixth insulation layer L6 may cover at least a portion of the top surface of the light emitting element ED.

The light emitting element ED may be electrically connected to the first electrode E1 by the first connection electrode CNE1, and may be electrically connected to the second electrode E2 by a second connection electrode CNE2.

The second connection electrode CNE2 may be disposed on the light emitting element ED and the second electrode E2. On the second connection electrode CNE2, a seventh insulation layer L7 may be disposed. The first connection electrode CNE1 may be disposed on the light emitting element ED and the first electrode E1. Even when the length of the light emitting element ED is several hundreds of micrometers or less, the second connection electrode CNE2 and the first connection electrode CNE1 may not be in direct contact with each other by the seventh insulation layer L7. However, this is only an example of the inventive concept. In another exemplary embodiment of the inventive concept, the first connection electrode CNE1 and the second connection electrode CNE2 may be simultaneously formed through the same process. In this exemplary embodiment, the seventh insulation layer L7 may be omitted.

The first connection electrode CNE1 and the second connection electrode CNE2 may include a conductive material. For example, the conductive material may include at least any one of indium zinc oxide (IZO), indium tin oxide (ITO), indium gallium oxide (IGO), indium zinc gallium oxide (IGZO), or a mixture/compound thereof. However, the inventive concept is not limited thereto. For example, the conductive material may be a metal material, and the metal material may include, for example, molybdenum, silver, titanium, copper, aluminum, or an alloy thereof.

On the first connection electrode CNE1 and the seventh insulation layer L7, an eighth insulation layer L8 may be disposed. The eighth insulation layer L8 may be an encapsulation layer.

On one surface of the second base layer BL2 facing the first base layer BL1, a light blocking layer BM may be disposed. The light blocking layer BM is provided with an opening, and a wavelength conversion unit CL may cover the opening. A region exposed by the opening may correspond to a pixel light emitting area PXA.

The wavelength conversion unit CL may include a light emitting body. For example, the light emitting body absorbs a first light provided from the light emitting element ED and converts the wavelength of the first light to emit a second light of a color different from that of the first light. The light emitting body may be, for example, a quantum dot. The first light may be blue light, and the second light may be green light or red light. However, this is only exemplary, and the inventive concept is not limited thereto. Also, in another exemplary embodiment of the inventive concept, the wavelength conversion unit CL may be substituted with a color filter. The color filter may absorb light of a specific wavelength to implement a color. In yet another exemplary embodiment of the inventive concept, the wavelength conversion unit CL may be omitted. In this case, the light emitting element ED may emit blue light, green light, or red light.

Between the wavelength conversion unit CL and the eighth insulation layer L8, a ninth insulation layer L9 may be disposed. For example, by the ninth insulation layer L9, the first base layer BL1 on which the pixel circuit PXC (see FIG. 3) and the light emitting element ED are disposed and the second base layer BL2 on which the wavelength conversion unit CL and the light blocking layer BM are disposed may be combined. For example, the ninth insulation layer L9 may be an optically clear adhesive film, an optically clear resin, or a pressure sensitive adhesive film. However, this is only an example, and in another exemplary embodiment of the inventive concept, the ninth insulation layer L9 may be omitted.

FIG. 7A to FIG. 7G are cross-sectional views sequentially showing steps of manufacturing a display device according to an exemplary embodiment of the inventive concept. Hereinafter, with reference to FIG. 7A to FIG. 7G, a method for manufacturing a display device according to an embodiment of the inventive concept will be described.

Figure 7A:
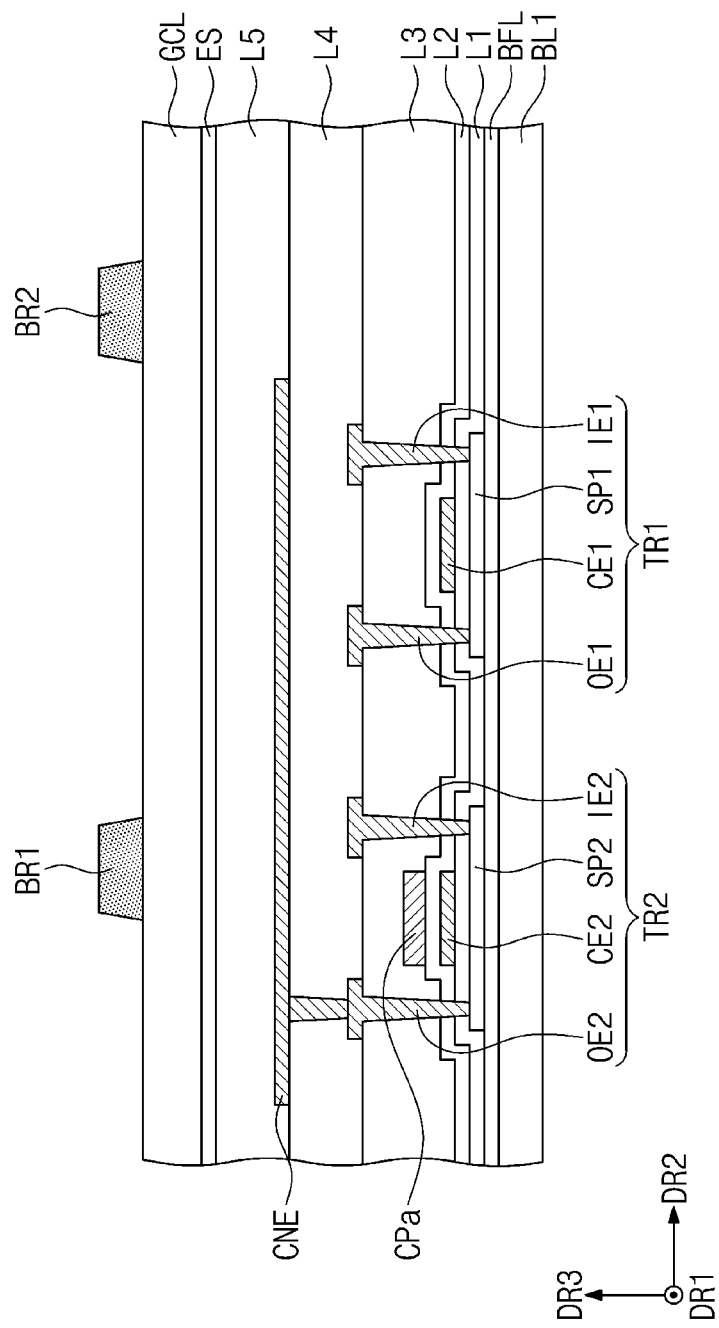
FIGS. 7A, 7B, 7C, 7D, 7E, 7F, and 7G are cross-sectional views sequentially showing steps of manufacturing a display device according to an exemplary embodiment of the inventive concept.

Referring to FIG. 7A, a first base layer BL1 is prepared. Although not separately shown, in a manufacturing process, the first base layer BL1 may be disposed on a working substrate (not shown). After a display panel is manufactured, the working substrate may be removed.

On the first base layer BL1, a pixel circuit PXC (see FIG. 3) including a first thin film transistor TR1 and a second thin film transistor TR2 are formed. A fifth insulation layer L5 covering the pixel circuit PXC is formed. The fifth insulation layer L5 may include an inorganic material. The fifth insulation layer L5 may provide a flat surface.

On the fifth insulation layer L5, an etching prevention layer ES is formed. Thereafter, on the etching prevention layer ES, a guide insulation layer GCL is formed.

The etching rate of a material constituting the guide insulation layer GCL is faster than the etching rate of a material constituting the etching prevention layer ES. The material constituting the etching prevention layer ES and the material constituting the guide insulation layer GCL may have an etching selectivity of 1:N. At this time, N may be 2 or more.

In an exemplary embodiment of the inventive concept, the etching prevention layer ES may be formed of silicon oxide, and the guide insulation layer GCL may be formed of silicon nitride.

Thereafter, on the guide insulation layer GCL, a first wall BR1 and a second wall BR2 are formed. The first wall BR1 and the second wall BR2 may be formed by forming an insulation material on the guide insulation layer GCL and then patterning the insulation material.

Figure 7B:
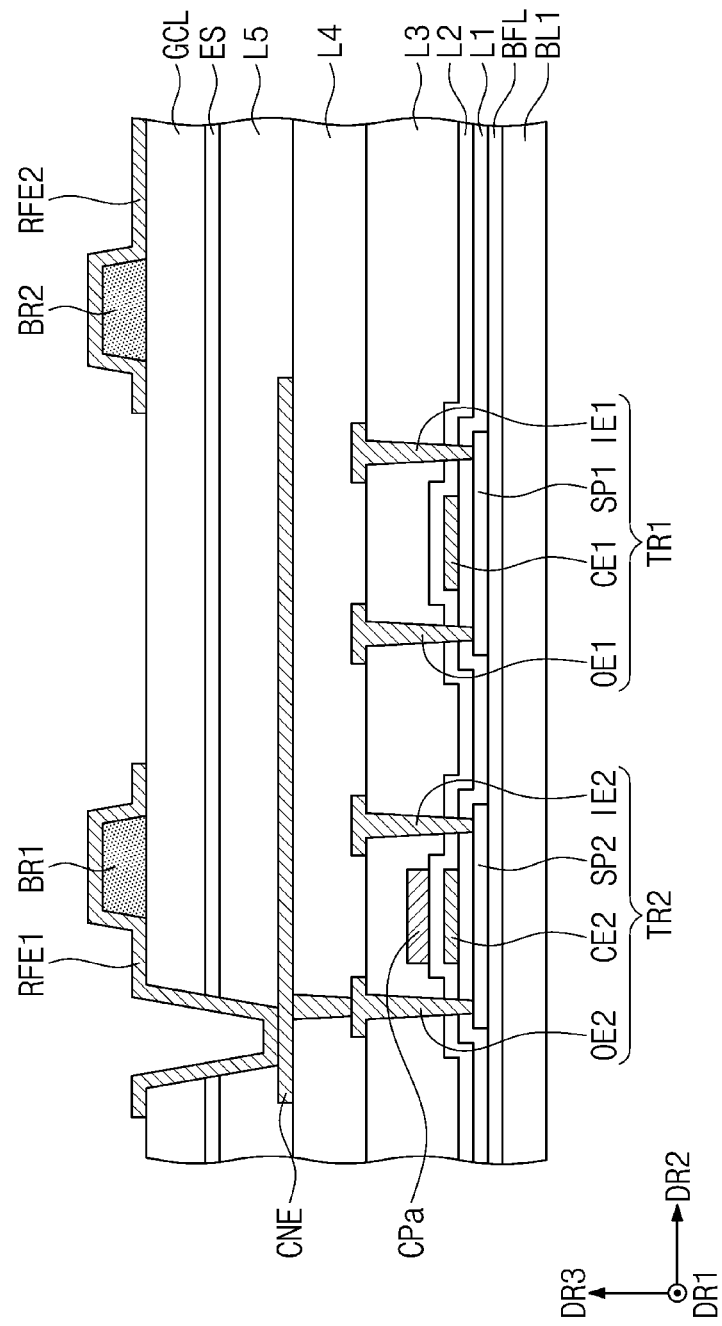

Thereafter, referring to FIG. 7B, on the guide insulation layer GCL, the first wall BR1, and the second wall BR2, a first reflective electrode RFE1 and a second reflective electrode RFE2 are formed. The first reflective electrode RFE1 and the second reflective electrode RFE2 may be formed by depositing a conductive material on the guide insulation layer GCL, the first wall BR1, and the second wall BR2, and then patterning. Each of the first reflective electrode RFE1 and the second reflective electrode RFE2 may have a structure in which indium tin oxide (ITO), silver (Ag), and indium tin oxide (ITO) are sequentially laminated.

Figure 7C:
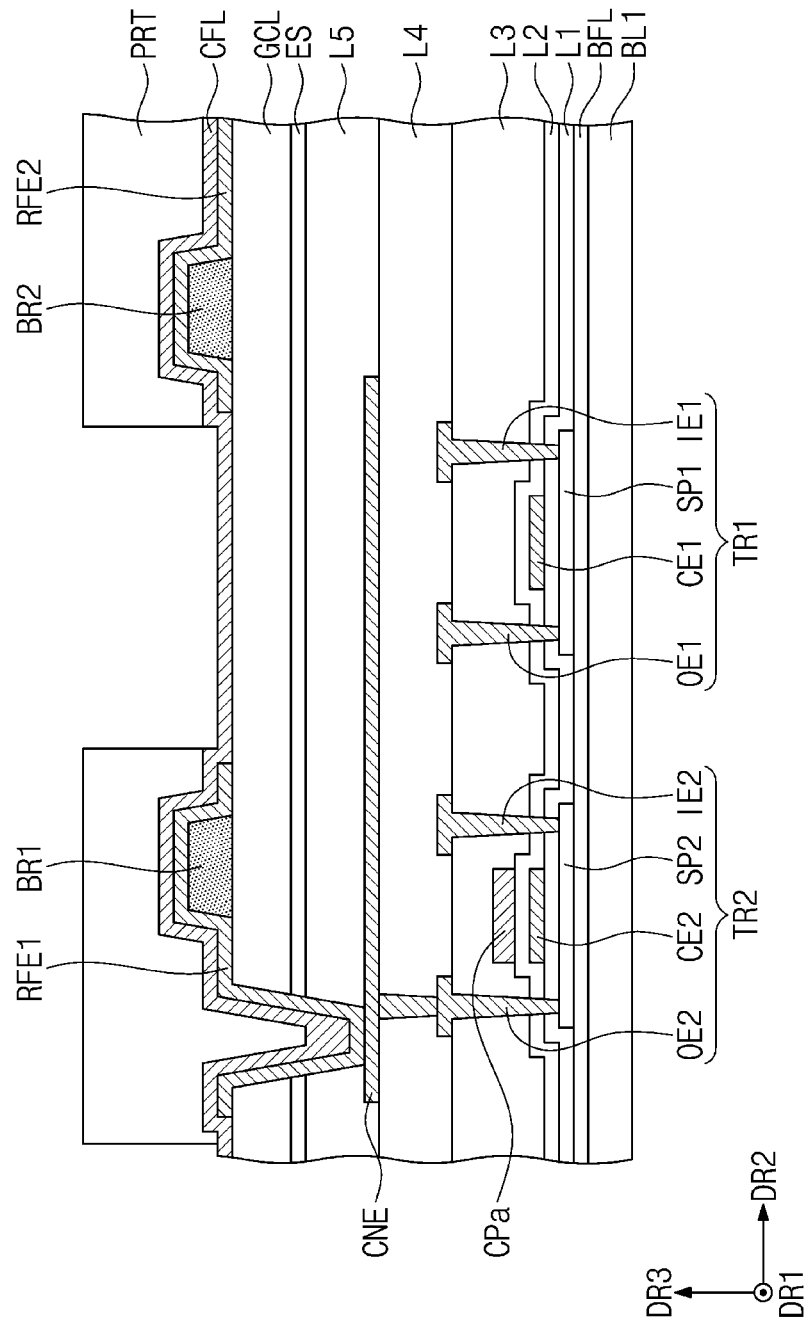

Thereafter, referring to FIG. 7C, on the first reflective electrode RFE1 and the second reflective electrode RFE2, a capping layer CFL is formed. The capping layer CFL may be formed on the entire guide insulation layer GCL on which the first reflective electrode RFE1 and the second reflective electrode RFE2 are formed. The capping layer CFL may include at least any one of indium zinc oxide (IZO), indium tin oxide (ITO), indium gallium oxide (IGO), indium zinc gallium oxide (IGZO), or a mixture/compound thereof.

Thereafter, on the capping layer CFL, a photoresist pattern PRT is formed. The photoresist pattern PRT may be formed to overlap a region in which a first capping electrode CPE1 and a second capping electrode CPE2 to be described later are to be formed. The photoresist pattern PRT may be formed by applying a photoresist material on the capping layer CFL and then patterning.

Figure 7D:
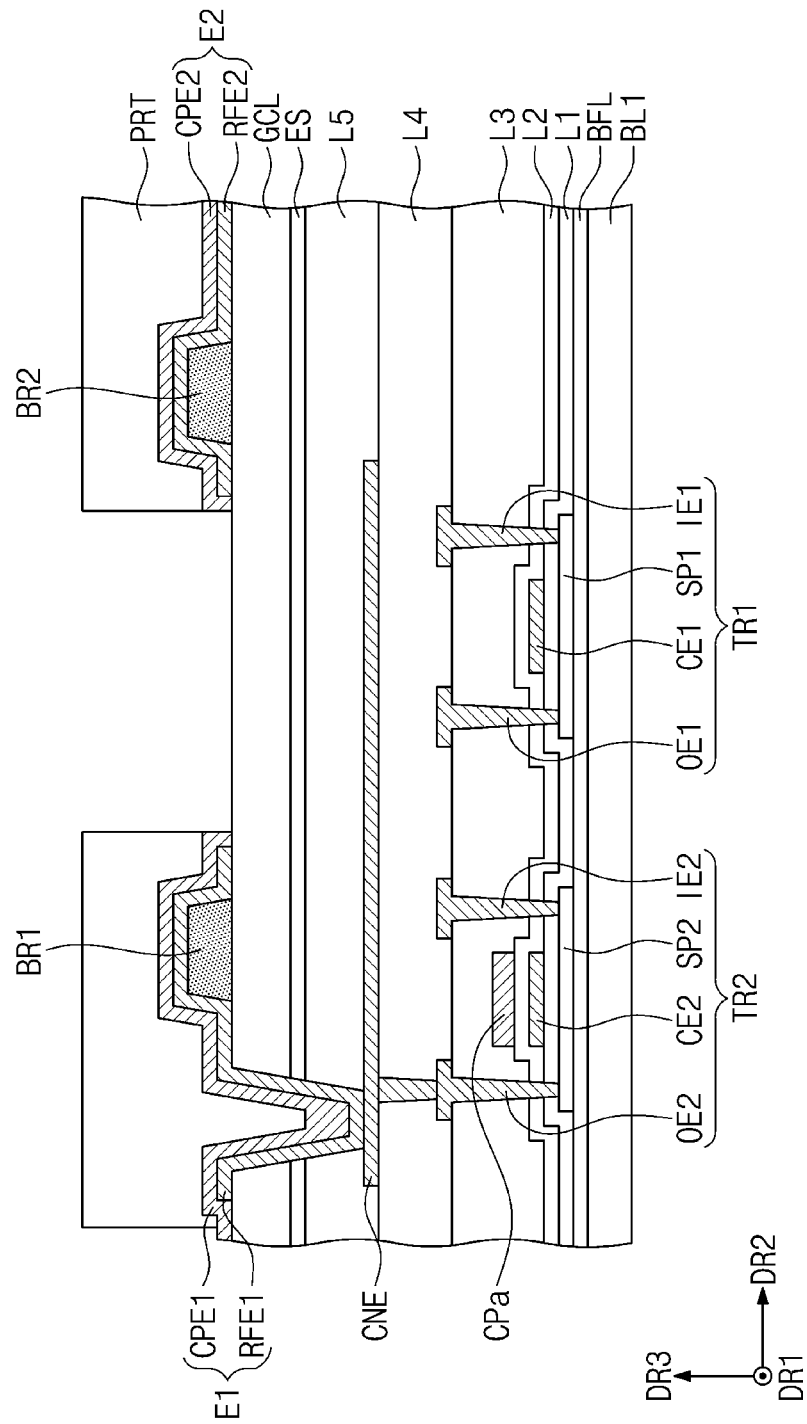

Thereafter, referring to FIG. 7D, using the photoresist pattern PRT as a mask, the capping layer CFL is patterned to form the first capping electrode CPE1 and the second capping electrode CPE2. At this time, the capping layer CFL may be patterned through a wet etching process. Through the process shown in FIG. 7D, a first electrode E1 including the first reflective electrode RFE1 and the first capping electrode CPE1 may be formed, and a second electrode E2 including the second reflective electrode RFE2 and the second capping electrode CPE2 may be formed.

Figure 7E:
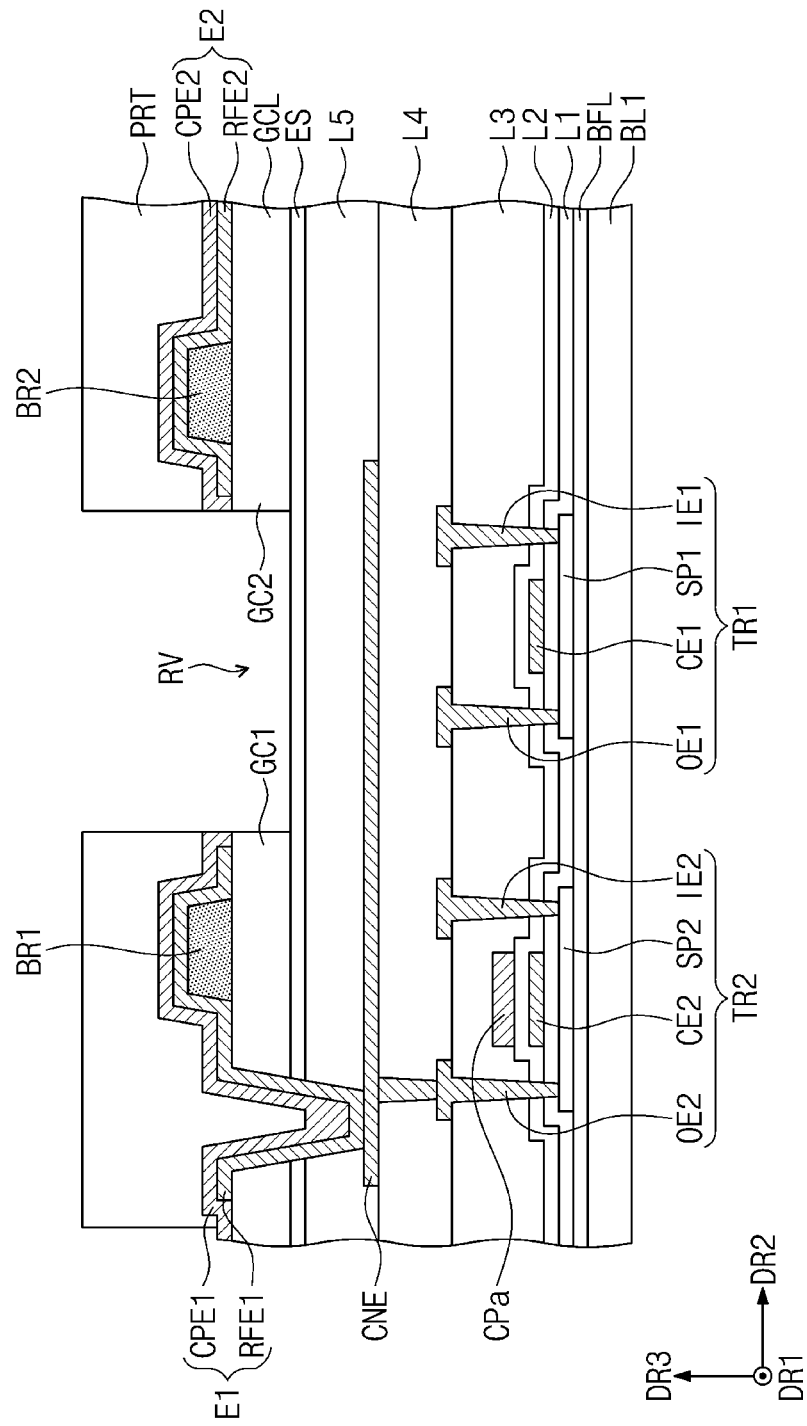

Thereafter, referring to FIG. 7E, using the photoresist pattern PRT as a mask, the guide insulation layer GCL is patterned to form a first guide layer GC1 and a second guide layer GC2. At this time, the guide insulation layer GCL may be patterned through a dry etching process.

Since the guide insulation layer GCL and the etching prevention layer ES have a different etching selectivity, only the guide insulation layer GCL may be etched, not the etching prevention layer ES. As the first guide layer GC1 and the second guide layer GC2 are formed, a seating groove RV may be defined between the first guide layer GC1 and the second guide layer GC2.

The capping layer CFL and the guide insulation layer GCL described with reference to FIG. 7D may all be patterned using the photoresist pattern PRT as a mask. Accordingly, since there is no need to form two photoresist patterns to pattern the capping layer CFL and the guide insulation layer GCL, the process may be simplified and manufacturing time and cost may be reduced.

Thereafter, the photoresist pattern PRT may be removed.

Figure 7F:
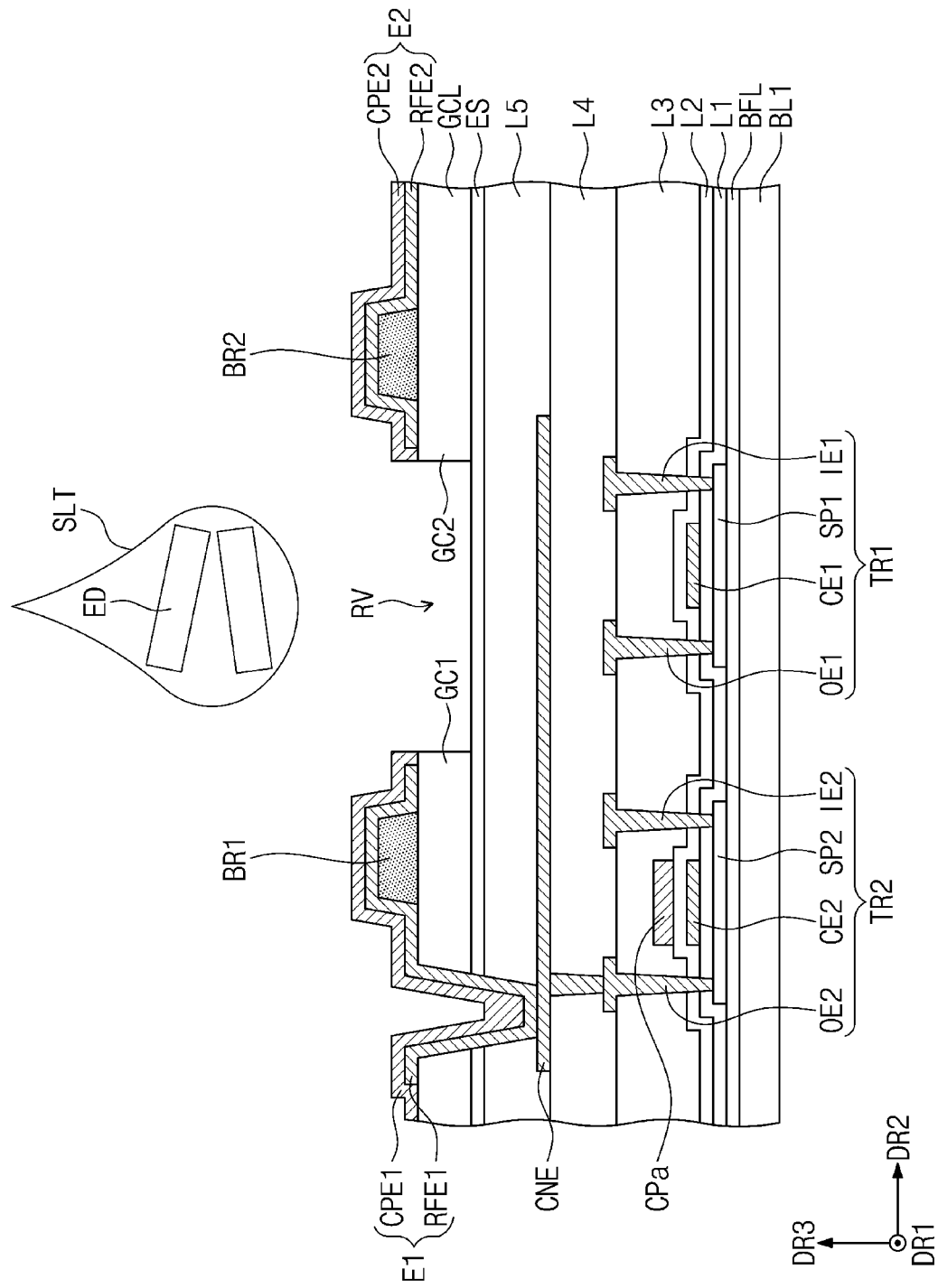

Thereafter, referring to FIG. 7F, a solvent SLT, such as ink or paste containing the light emitting element ED, is provided on the first electrode E1 and the second electrode E2. The solvent SLT may be a material that may be vaporized at room temperature or by heat. The light emitting element ED may be disposed in the seating groove RV between the first guide layer GC1 and the second guide layer GC2.

When the light emitting element ED is not disposed between the first electrode E1 and the second electrode E2, but disposed in an unintended region other than the region between the first electrode E1 and the second electrode E2, the light emitting element ED may act as a conductor so that wires designed to be separated from each other may be short-circuited. According to an exemplary embodiment of the inventive concept, the light emitting element ED is disposed in the seating groove RV by the first guide layer GC1 and the second guide layer GC2, and thus, may be stably disposed in a region between the first electrode E1 and the second electrode E2. Accordingly, the probability that the light emitting device ED is effectively aligned may be increased, and thus, product yield and product reliability may be improved. Also, the problem that wires are short-circuited by the light emitting element ED in an unintended region other than the region between the first electrode E1 and the second electrode E2 may be prevented in advance.

Power is applied to the first electrode E1 and the second electrode E2 to form an electric field between the first electrode E1 and the second electrode E2. Bipolarity is induced in the light emitting element ED by the electric field, and the light emitting element ED may be aligned between the first electrode E1 and the second electrode E2 by dielectrophoretic force. According to an exemplary embodiment of the inventive concept, the light emitting element ED is provided in the seating groove RV. Accordingly, when compared with a comparative example in which a light emitting element is disposed above a first electrode and a second electrode, the light emitting element ED according to an exemplary embodiment of the inventive concept may be even more strongly influenced by an electric field formed between the first electrode E1 and the second electrode E2 in the second direction DR2. Accordingly, according to an exemplary embodiment of the inventive concept, the dielectrophoretic force generated in the light emitting element ED may be increased, and the alignment of the light emitting element ED may be more facilitated. Accordingly, the probability that the light emitting device ED is effectively aligned may be increased, and thus, product yield and product reliability may be improved.

Figure 7G:
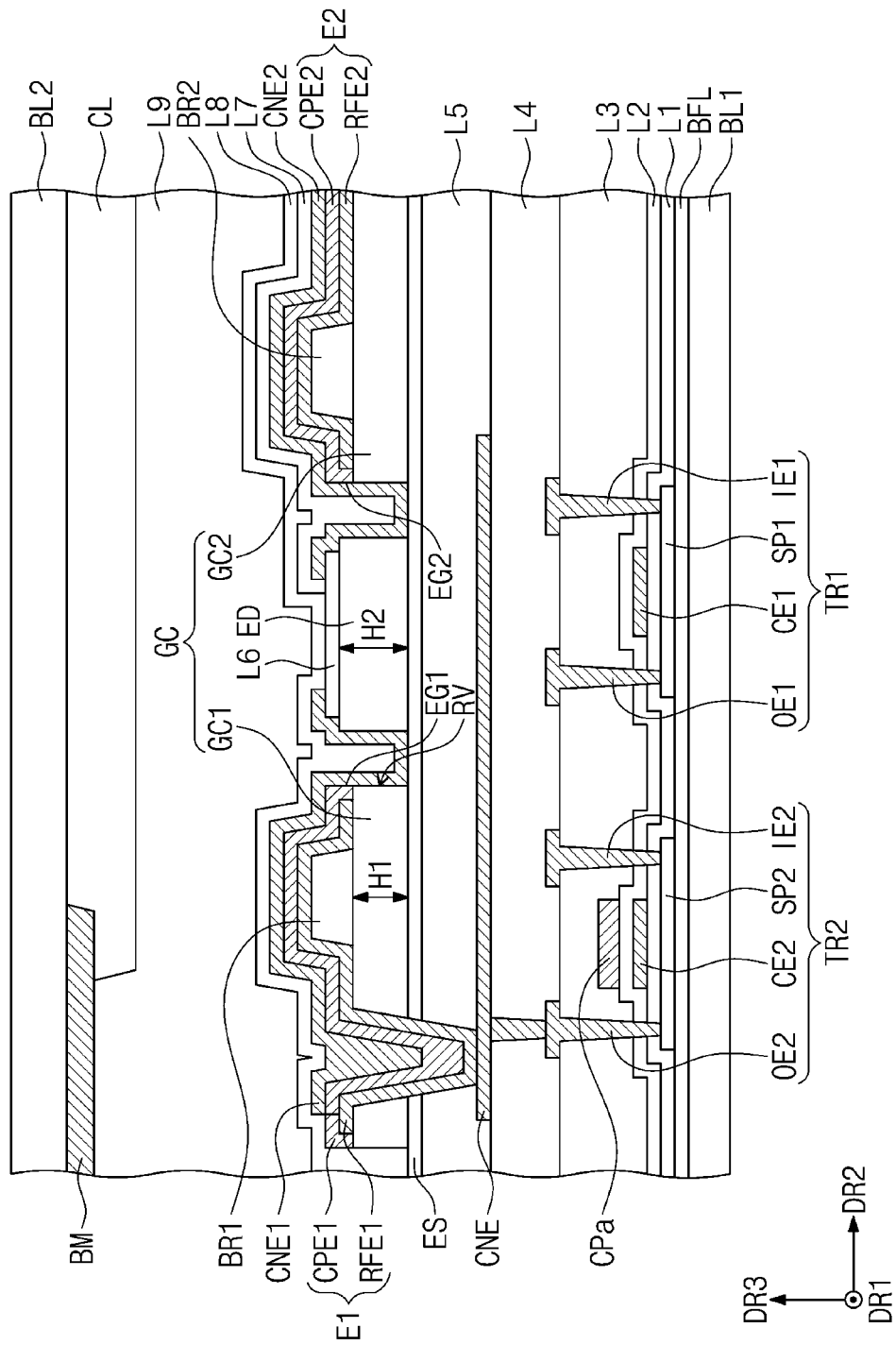

Thereafter, referring to FIG. 7G, on the light emitting element ED, a sixth insulation layer L6, a first connection electrode CNE1, a second connection electrode CNE2, a seventh insulation layer L7, and an eighth insulation layer L8 are sequentially formed. Thereby, a first substrate may be manufactured.

Next, on one surface of a second base layer BL2, a light blocking layer BM and a wavelength conversion unit CL are formed. Thereby, a second substrate may be manufactured.

The first substrate and the second substrate may be bonded using a ninth insulation layer L9. However, the embodiment of the inventive concept is not limited thereto, and the ninth insulation layer L9 and the second base layer BL2 may be omitted, and the light blocking layer BM and the wavelength conversion unit CL may be formed to be included in the first substrate.

According to a display device according to an exemplary embodiment of the inventive concept, a light emitting element may be disposed in a seating groove defined between a first guide layer and a second guide layer. Accordingly, the light emitting element may be stably disposed in a region between a first electrode and a second electrode. Accordingly, the probability that the light emitting device is effectively aligned may be increased, and thus, product yield and product reliability may be improved.

Also, since the light emitting element is aligned by an electric field applied in the seating groove, the light emitting element may not be disposed outside the seating groove. Accordingly, the problem that wires are short-circuited by the light emitting element in an unintended region other than the region between the first electrode and the second electrode may be prevented in advance.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a first wall structure disposed on a substrate;
a second wall structure disposed on the substrate and spaced apart from the first wall structure;
a first electrode disposed on the first wall structure;
a second electrode disposed on the second wall structure and spaced apart from the first electrode;
a light emitting element disposed between the first wall structure and the second wall structure, the light emitting element electrically connected with the first electrode and the second electrode;
a first insulating layer disposed between the substrate and the light emitting element;
a first connection electrode disposed on the first electrode and directly contacting with a first end portion of the light emitting element, and
a second connection electrode disposed on the second electrode and directly contacting with a second end portion of the light emitting element, wherein
the first wall structure comprises a first guide layer disposed on the substrate and a first wall directly disposed on the first guide layer.

2. The display device of claim 1, wherein
the second wall structure comprises a second guide layer disposed on the substrate and a second wall directly disposed on the second guide layer.

3. The display device of claim 2, wherein the light emitting element is disposed between the first guide layer and the second guide layer.

4. The display device of claim 2, wherein a material constituting the first insulating layer and a material constituting each of the first guide layer and the second guide layer have an etching selectivity of 1:N where N is 2 or more.

5. The display device of claim 4, wherein
the first insulating layer contains silicon oxide, and
the first guide layer and the second guide layer each contain silicon nitride.

6. The display device of claim 1, wherein the light emitting element directly contacts the first insulating layer.

7. The display device of claim 1, wherein the light emitting element comprises:
a first semiconductor layer;
a second semiconductor layer;
an active layer disposed between the first semiconductor layer and the second semiconductor layer; and
at least one insulating film covering at least an outer surface of the active layer.

8. The display device of claim 7, wherein
the light emitting element further comprise at least one contact electrode layer on end of the first semiconductor layer or the second semiconductor layer, and
at least portion of a side surface of the contact electrode layer is covered by the insulating film.

9. The display device of claim 8, wherein
the first connection electrode contacts the contact electrode layer disposed on the second semiconductor layer of the light emitting element, and
the second connection electrode contacts the first semiconductor layer of the light emitting element.

10. The display device of claim 1, further comprising:
a second insulating layer disposed on the light emitting element and not overlapping with at least portion of the first end portion and at least portion of the second end portion of the light emitting element; and
a third insulating layer disposed on the second insulating layer.

11. The display device of claim 10, wherein
at least portion of the second connection electrode is directly disposed on the second insulating layer, and
the third insulating layer is directly disposed on the second connection electrode.

12. The display device of claim 10, wherein at least a portion of the first connection electrode is disposed on the second insulating layer.

13. The display device of claim 1, further comprising:
a fourth insulating layer disposed on the first connection electrode and the second connection electrode; and
a wavelength conversion layer disposed on the fourth insulating layer and comprising a light emitting body.

14. The display device of claim 1, further comprising:
a fifth insulating layer disposed between the first insulating layer and the substrate;
a connection electrode pattern disposed between the fifth insulating layer and the substrate; and
a pixel circuit disposed between the fifth insulating layer and the substrate and electrically connected to the connection electrode pattern,
wherein the first electrode is electrically connected to the connection electrode pattern.

15. The display device of claim 1, wherein the thickness of each of the first guide layer and the second guide layer is equal to or less than the thickness of the light emitting element.

16. The display device of claim 1, wherein
the first wall structure and the second wall structure are disposed in a common layer,
the first electrode is directly disposed on the first wall structure, and
the second electrode is directly disposed on the second wall structure.

17. The display device of claim 1, wherein
the first end portion of the light emitting element is a side surface of the light emitting element, and
the second end portion of the light emitting element is another side surface of the light emitting element.

18. The display device of claim 17, wherein
the first connection electrode makes direct contact with both the first end portion of the light emitting element and a top surface of the light emitting element, and
the second connection electrode makes direct contact with both the second end portion of the light emitting element and the top surface of the light emitting element.

19. The display device of claim 17, wherein the first connection electrode is spaced apart from the second connection electrode.

20. The display device of claim 1, further comprising a sixth insulation on the light emitting element, wherein the first connection electrode and the second connection electrode both terminate directly on the sixth insulation layer as seen in side view.

21. The display device of claim 1, wherein the first guide layer and the first wall form a step pattern.

* * * * *